(12) United States Patent
Chen (10) Patent No.: US 10,937,507 B2
(45) Date of Patent: Mar. 2, 2021

(54) BIT LINE DRIVER DEVICE INCLUDING ACTIVE REGION

(71) Applicant: Yangtze Memory Technologies Co., Ltd., Wuhan (CN)

(72) Inventor: Liang Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 14 days.

(21) Appl. No.: 16/379,777

(22) Filed: Apr. 9, 2019

(65) Prior Publication Data

US 2020/0273527 A1    Aug. 27, 2020

Related U.S. Application Data

(63) Continuation of application No. PCT/CN2019/076268, filed on Feb. 27, 2019.

(51) Int. Cl.

| | |
|---|---|
| *H01L 27/11529* | (2017.01) |
| *H01L 27/11565* | (2017.01) |
| *G11C 16/24* | (2006.01) |
| *G11C 5/06* | (2006.01) |
| *H01L 27/11519* | (2017.01) |
| *H01L 27/11524* | (2017.01) |
| *H01L 27/11556* | (2017.01) |
| *H01L 27/1157* | (2017.01) |

(Continued)

(52) U.S. Cl.
CPC ............. *G11C 16/24* (2013.01); *G11C 5/063* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ............................. G11C 16/24; H01L 27/0207
See application file for complete search history.

(56) References Cited

U.S. PATENT DOCUMENTS

| | | |
|---|---|---|
| 5,482,872 A | 1/1996 | Wu |
| 9,673,213 B1 | 6/2017 | Yu |
| 2008/0237586 A1 | 10/2008 | Sun |

(Continued)

FOREIGN PATENT DOCUMENTS

| | | |
|---|---|---|
| CN | 1971932 A | 5/2007 |
| CN | 101266975 A | 9/2008 |

(Continued)

*Primary Examiner* — Daniel Whalen
(74) *Attorney, Agent, or Firm* — Winston Hsu (57) ABSTRACT

A bit line driver device includes a semiconductor substrate and at least one isolation structure disposed in the semiconductor substrate. Active regions are defined in the semiconductor substrate by the at least one isolation structure. Each of the active regions is elongated in a first direction, and two of the active regions are disposed adjacent to each other in a second direction. Each of the active regions includes a first portion, a second portion, and a third portion. The third portion is disposed between the first portion and the second portion in the first direction. A width of the third portion is smaller than a width of the first portion and a width of the second portion. The distance between the two adjacent active regions may be increased by the third portions accordingly.

13 Claims, 9 Drawing Sheets

(51) Int. Cl.
*H01L 27/11573* (2017.01)
*H01L 27/11582* (2017.01)

(56) References Cited

U.S. PATENT DOCUMENTS

| | | |
|---|---|---|
| 2010/0034020 A1 | 2/2010 | Tanaka |
| 2010/0117156 A1 | 5/2010 | Tsutsui |
| 2011/0188309 A1 | 8/2011 | Endo |
| 2014/0191315 A1* | 7/2014 | Ito .................. H01L 29/785 257/336 |
| 2015/0137262 A1* | 5/2015 | Baek ................ H01L 27/0207 257/401 |
| 2016/0027784 A1 | 1/2016 | Yamazaki |
| 2018/0315747 A1 | 11/2018 | Agam |

FOREIGN PATENT DOCUMENTS

| | | |
|---|---|---|
| CN | 101432884 A | 5/2009 |
| CN | 105448734 A | 3/2016 |
| CN | 108091658 A | 5/2018 |
| JP | 2010-40658 A | 2/2010 |
| TW | 200525740 | 8/2005 |
| TW | 201724354 A | 7/2017 |

* cited by examiner

BIT LINE DRIVER DEVICE INCLUDING ACTIVE REGION

CROSS REFERENCE TO RELATED APPLICATIONS

This application is a continuation of International Application No. PCT/CN2019/076268 filed on Feb. 27, 2019, which is incorporated herein by reference in its entirety.

BACKGROUND OF THE INVENTION

1. Field of the Invention

The present disclosure relates to a bit line driver device, and more particularly, to a bit line driver device including a plurality of active regions.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. As the memory cell density in the 3D memory architecture increases, the dimensions of the components in the peripheral devices have to become smaller relatively especially when the memory array and the peripheral devices are formed on the same wafer and the area for the peripheral devices is limited. There are many issues generated when the dimensions of the peripheral devices shrink and have to be solved for developing 3D memory device with higher storage capacity.

SUMMARY OF THE INVENTION

A bit line (BL) driver device is provided in the present disclosure. Each active region is modified to have a portion with smaller width for increasing the distance between two adjacent active areas and improving electrical performance of the bit line driver device.

According to an embodiment of the present disclosure, a bit line driver device is provided. The bit line driver device includes a semiconductor substrate and at least one isolation structure disposed in the semiconductor substrate. Active regions are defined in the semiconductor substrate by the at least one isolation structure. Each of the active regions is elongated in a first direction, and two of the active regions are disposed adjacent to each other in a second direction. Each of the active regions includes a first portion, a second portion, and a third portion. The third portion is disposed between the first portion and the second portion in the first direction. A width of the third portion is smaller than a width of the first portion and a width of the second portion.

In some embodiments, the width of the first portion is equal to the width of the second portion.

In some embodiments, a distance between the third portions in the second direction is larger than a distance between the first portions in the second direction and a distance between the second portions in the second direction.

In some embodiments, the distance between the first portions in the second direction is equal to the distance between the second portions in the second direction.

In some embodiments, a pitch between the third portions in the second direction is equal to a pitch between the first portions in the second direction and a pitch between the second portions in the second direction.

In some embodiments, the bit line driver device further includes a gate structure disposed on the semiconductor substrate. The gate structure is elongated in the second direction, and the gate structure partially overlaps each of the active regions.

In some embodiments, the gate structure partially overlaps the second portions in a thickness direction of the semiconductor substrate.

In some embodiments, the gate structure partially overlaps the third portions in a thickness direction of the semiconductor substrate.

In some embodiments, the gate structure does not overlap the first portions a thickness direction of the semiconductor substrate.

In some embodiments, the bit line driver device further includes drain regions and source regions. The drain regions and the source regions are disposed in the active regions. At least a part of each of the drain regions is disposed in one of the first portions. At least a part of each of the source regions is disposed in one of the second portions. The drain region and the source region disposed in the same active region are disposed at two opposite sides of the gate structure in the first direction.

In some embodiments, each of the drain regions is further disposed in the third portion.

In some embodiments, a minimum length of each of the drain regions in the second direction is equal to the width of each of the third portions.

In some embodiments, a maximum length of each of the drain regions in the second direction is equal to the width of each of the first portions.

In some embodiments, a length of each of the drain regions in the first direction is larger than a length of each of the source regions in the first direction.

In some embodiments, a length of each of the source regions in the first direction is equal to a length of each of the first portions in the first direction.

In some embodiments, a length of each of the source regions in the second direction is equal to a length of each of the first portions in the second direction.

In some embodiments, each of the source regions is further disposed in the third portion.

In some embodiments, a minimum length of each of the source regions in the second direction is equal to the width of each of the third portions.

In some embodiments, a maximum length of each of the source regions in the second direction is equal to a maximum length of each of the drain regions in the second direction.

In some embodiments, the first direction and the second direction are orthogonal to a thickness direction of the semiconductor substrate.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 4-6 are schematic drawings illustrating a manufacturing method of the bit line driver device according to the first embodiment of the present disclosure, wherein FIG. 5 is a schematic drawing in a step subsequent to FIG. 4, and FIG. 6 is a schematic drawing in a step subsequent to FIG. 5.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
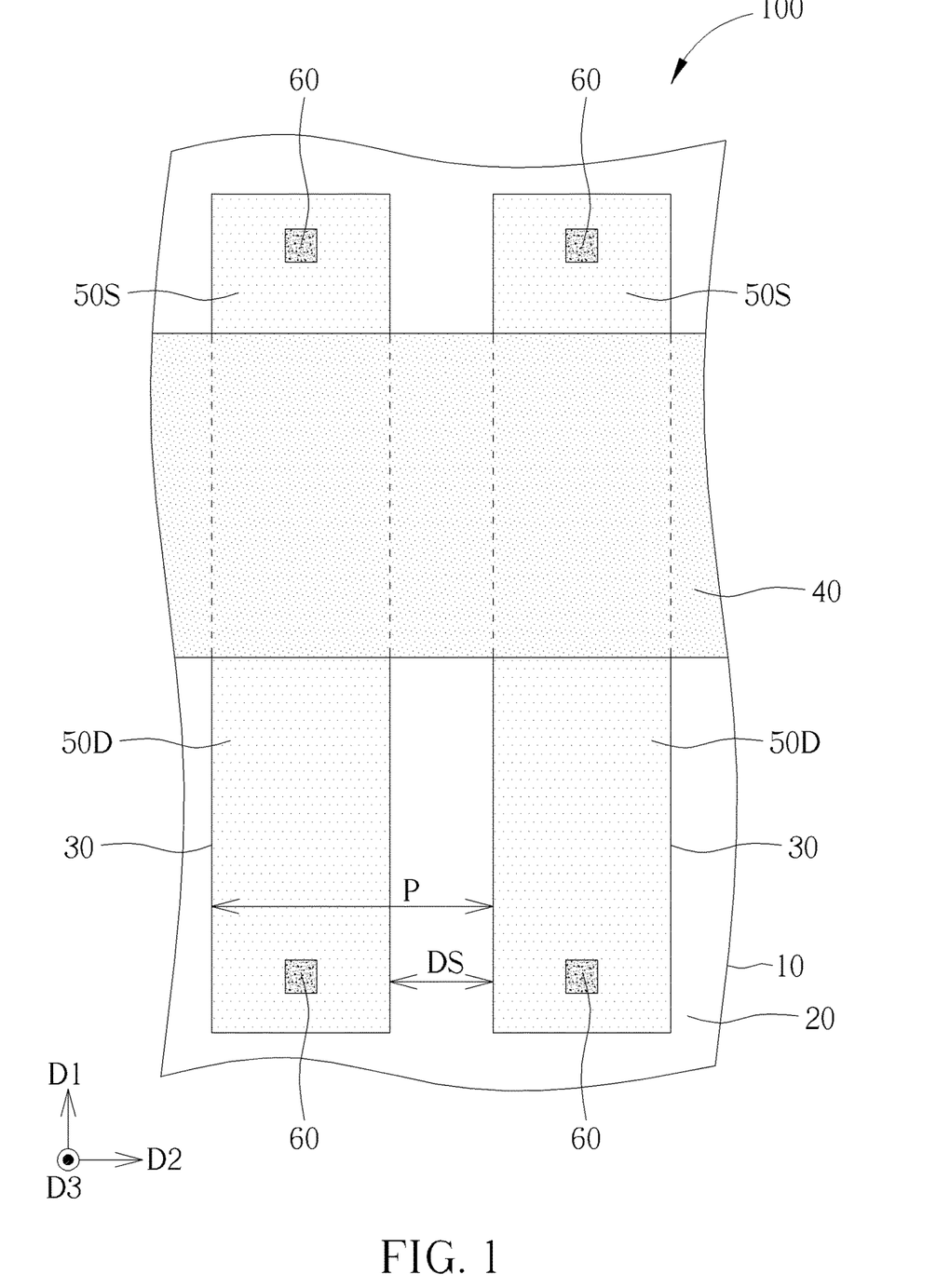
FIG. 1 is a schematic drawing illustrating a bit line driver device according to an embodiment of the present disclosure.

Please refer to FIG. 1. FIG. 1 is a schematic drawing illustrating a bit line driver device according to an embodiment of the present disclosure. Specifically, FIG. 1 is a top view diagram of a part of a bit line driver device 100. As shown in FIG. 1, the bit line driver device 100 includes a semiconductor substrate 10 and at least one isolation structure 20 disposed in the semiconductor substrate 10 for defining active regions 30 in the semiconductor substrate 10. In other words, the active regions 30 may be a part of the semiconductor substrate 10 and are separated from one another by the at least one isolation structure 20. In some embodiments, the semiconductor substrate 10 may include a silicon substrate, an epitaxial silicon substrate, a silicon germanium substrate, a silicon carbide substrate, a silicon-on-insulator (SOI) substrate, or substrates made of other suitable semiconductor materials. In some embodiments, the isolation structure 20 may include one layer or multiple layers of insulation materials, such as silicon nitride, silicon oxynitride, silicon carbonitride, or other suitable insulation materials, and the isolation structure 20 may be regarded as a shallow trench isolation (STI), but not limited thereto.

Each of the active regions 30 may be elongated in a first direction D1, and two of the active regions 30 may be disposed adjacent to each other in a second direction D2. In some embodiments, the second direction D2 may be substantially perpendicular to the first direction D1, but not limited thereto. In some embodiments, the first direction D1 and the second direction D2 may be orthogonal to a thickness direction of the semiconductor substrate 10 (such as a third direction D3 shown in FIG. 1). In other words, the first direction D1 and the second direction D1 may be regarded as horizontal directions parallel to a top surface of the semiconductor substrate 10, but not limited thereto. The length of each of the active regions 30 in the first direction D1 is larger than the length of each of the active regions 30 in the second direction D2, and the length of each of the active regions 30 in the second direction D2 may be regarded as the width of each of the active regions 30 accordingly. In this embodiment, each of the active regions 30 may be a stripe pattern and has only one width.

In some embodiments, the bit line driver device 100 may further include a gate structure 40, source regions 50S, and drain regions 50D. The gate structure 40 is disposed on the semiconductor substrate 10. In some embodiments, the gate structure 40 may be elongated in the second direction D2 and partially overlap each of the active regions 30. One of the source regions 50S and one of the drain regions 50D may be disposed in the same active region 30 and disposed at two opposite sides of the gate structure 40 in the first direction D1. One of the active regions 30, the source region 50S disposed in this active region 30, the drain region 50D disposed in this active region 30, and the part of the gate structure 40 overlapping this active region 30 may constitute a transistor. Therefore, the bit line driver device 100 may include at least two transistors, and the gate structure 40 may be shared by the two transistors, but not limited thereto. In some embodiments, the bit line driver device 100 may further include a plurality of conductive structures 60 disposed on the source regions 50S and the drain regions 50D respectively. The conductive structures 60 may be regarded as conductive plugs penetrating a dielectric layer (not shown) covering the source regions 50S and the drain regions 50D for being electrically connected with the source regions 50S and the drain regions 50D respectively. In some embodiments, the source regions 50S and the drain regions 50D may be doped regions, epitaxial structures, or other suitable types of source/drain structures in the active regions 30. For example, the doped region described above may include a boron doped region, a phosphorus doped region, an arsenic doped region, or the active region 30 doped with other appropriate dopants.

In some embodiments, the gate structure 40 may include a gate dielectric layer (not shown), a gate electrode (not shown) disposed on the gate dielectric layer, and a spacer (not shown) disposed on the sidewall of the gate electrode, but not limited thereto. The gate dielectric layer described above may include a silicon oxide layer, a high dielectric constant (high-k) dielectric layer, or other suitable dielectric materials. The high-k dielectric layer may include aluminum oxide ($Al_2O_3$), tantalum oxide ($Ta_2O_5$), zirconium oxide ($ZrO_2$), or other suitable high-k materials. The conductive structures 60 and the gate electrode described above may respectively include a non-metallic conductive material, such as polysilicon, a metallic conductive material, such as aluminum (Al), tungsten (W), copper (Cu), titanium aluminide (TiAl), tantalum nitride (TaN), and titanium nitride (TiN), or other suitable conductive materials. The spacer described above may include silicon nitride, silicon oxynitride, silicon carbonitride, or other suitable insulation materials, and the spacer may be a single layer structure or multiple layer structure composed of insulation materials.

In some embodiments, each of the transistors in the bit line driver device 100 may be electrically connected to a plurality of bit lines (not shown) in a memory cell array (not shown), such as a 3D NAND memory cell array, disposed on the semiconductor substrate 10. As the memory cell density in the 3D NAND memory cell array increases, the numbers of the bit lines are increased relatively, and the pitch P between the active regions 30 and the distance DS between the active regions 30 in the second direction D2 have to be reduced because the area for the bit line driver device 100 on the semiconductor substrate 10 is limited. For example, when the pitch between the bit lines is about 39 nm and each of the transistors in the bit line driver device 100 is electrically connected to 24 bit lines, the pitch P between the active regions 30 will be about 0.936 μm. The width of the active region 30 has to be kept within a specific range and the distance DS between the active regions 30 will be too small when the pitch P between the active regions 30 has to be reduced. Some electrical performance of the bit line driver device 100, such as drain-source breakdown voltage (BVdss) and/or punch-through voltage, will be influenced by the reduced distance DS between the active regions 30. For instance, when erase voltage in an operation of the 3D NAND memory cell array is about 22V, the BVdss of the bit line driver device has to be higher than 24V, and the punch-through voltage between the transistors in the bit line driver device has to be higher than 3.5V preferably. However, it is difficult for bit line driver device 100 to achieve the electrical performance described.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 2:
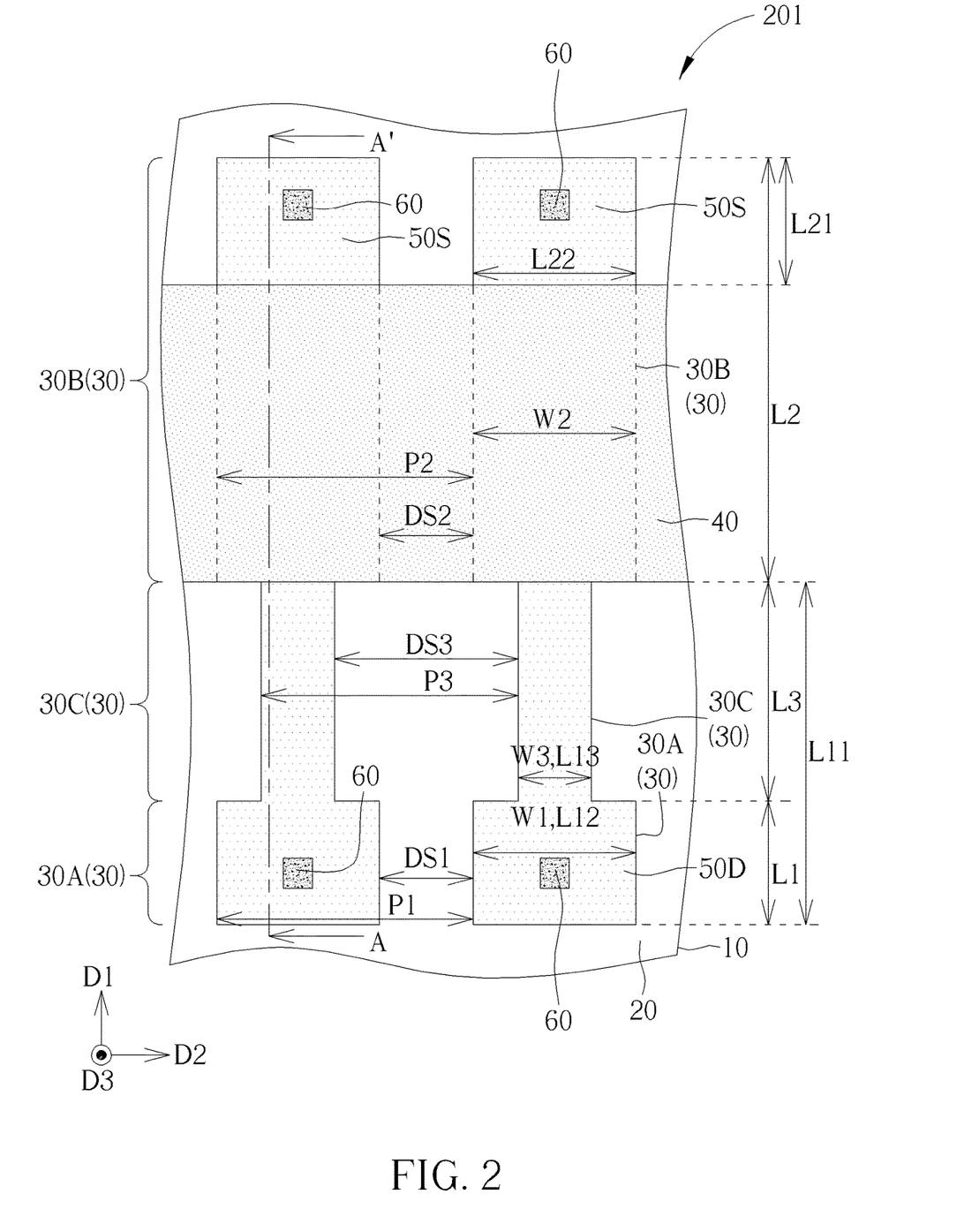
FIG. 2 is a schematic drawing illustrating a bit line driver device according to a first embodiment of the present disclosure.
Figure 3:
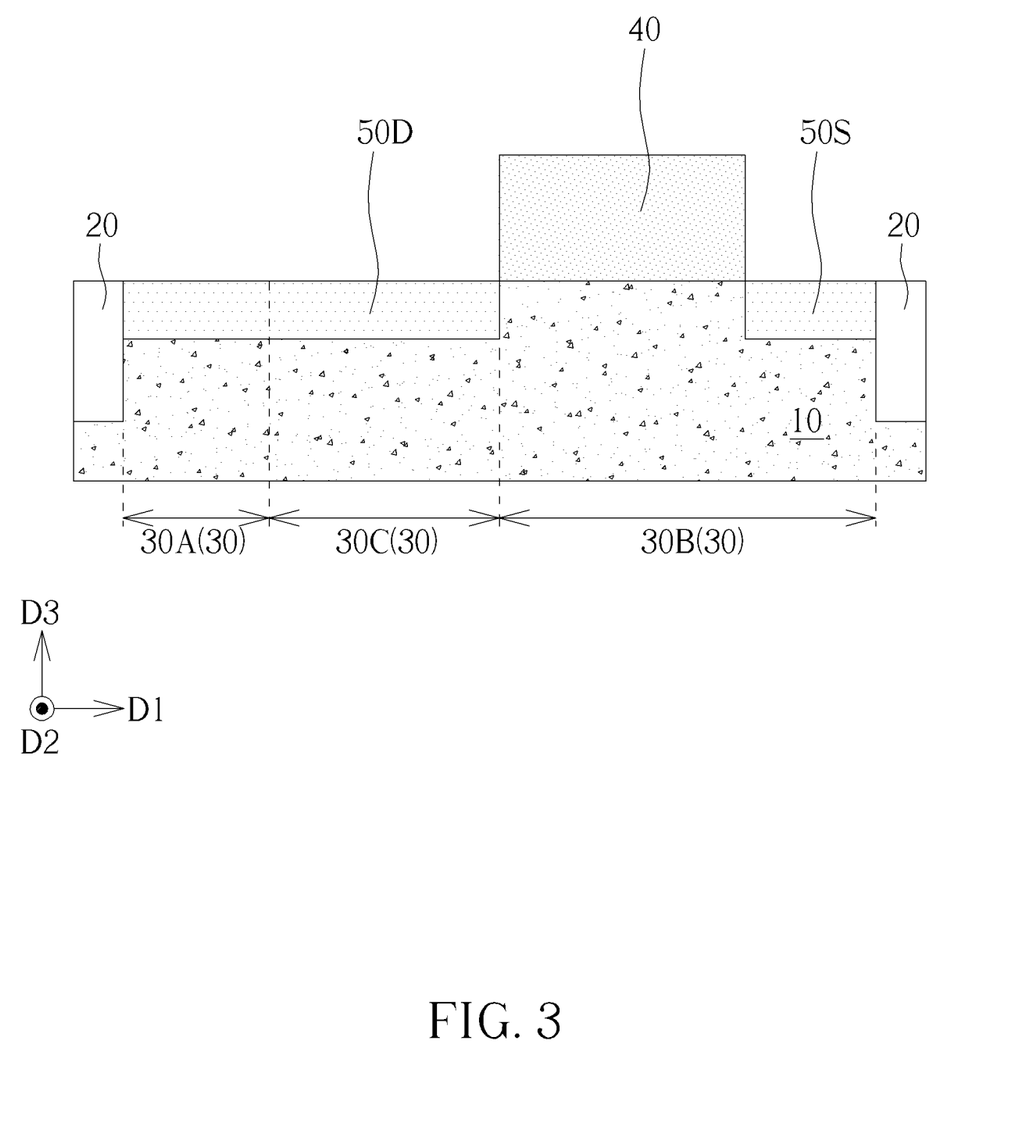
FIG. 3 is a cross-sectional diagram taken along a line A-A' in FIG. 2.

Please refer to FIG. 2 and FIG. 3. FIG. 2 is a schematic drawing illustrating a bit line driver device 201 according to a first embodiment of the present disclosure. FIG. 3 is a cross-sectional diagram taken along a line A-A' in FIG. 2. As shown in FIG. 2 and FIG. 3, the bit line driver device 201 includes the semiconductor substrate 10 and the isolation structure 20 disposed in the semiconductor substrate 10 for defining the active regions 30 in the semiconductor substrate 10. In this embodiment, each of the active regions 30 includes a first portion 30A, a second portion 30B, and a third portion 30C. The third portion 30C is disposed between the first portion 30A and the second portion 30B in the first direction D1, and a width of the third portion 30C (such as a third width W3 shown in FIG. 2) is smaller than a width of the first portion 30A (such as a first width W1 shown in FIG. 2) and a width of the second portion 30B (such as a second width W2 shown in FIG. 2). In some embodiments, the first portion 30A and the second portion 30B may be located at two opposite ends of the active region 30 in the first direction D1, but not limited thereto. Compared with the bit line driver device 100 shown in FIG. 1, the distance between portions of the two adjacent active regions 30 is enlarged, and the related electrical performance of the bit line driver device 201, such as drain-source breakdown voltage (BVdss) and/or punch-through voltage, may be improved accordingly.

Specifically, a distance between the third portions 30C in the second direction D2 (such as a third distance DS3 shown in FIG. 2) is larger than a distance between the first portions 30A in the second direction D2 (such as a first distance DS1 shown in FIG. 2) and a distance between the second portions 30B in the second direction D2 (such as a second distance DS2 shown in FIG. 2). In some embodiments, the first width W1 of each of the first portions 30A may be equal to the second width W2 of each of the second portions 30B, and the first distance DS1 between the first portions 30A in the second direction DS may be equal to the second distance DS2 between the second portions 30B in the second direction D2, but not limited thereto. In some embodiments, in each of the active regions 30, the first portion 30A may be directly connected with the third portion 30C, and the third portion 30C may be directly connected with the second portion 30B. In some embodiments, a pitch between the third portions 30C in the second direction D2 (such as a third pitch P3 shown in FIG. 2) may be equal to a pitch between the first portions 30A in the second direction D2 (such as a first pitch P1 shown in FIG. 2) and a pitch between the second portions 30B in the second direction D2 (such as a second pitch P2 shown in FIG. 2), but not limited thereto. In other words, the pitch between the active regions 30 in the second direction D2 may be unchanged at different portions of the active regions 30 when the width of the middle portion of the active region 30 is reduced.

As shown in FIG. 2 and FIG. 3, the bit line driver device 201 also includes the gate structure 40, the source regions 50S, the drain regions 50D, and the conductive structures 60 described above. In this embodiment, the gate structure 40 may partially overlap the second portions 30B in the thickness direction of the semiconductor substrate 10 (e.g. the third direction D3) without overlapping the first portions 30A and the third portions 30C in the third direction D3, but not limited thereto. At least a part of each of the drain regions 50D may be disposed in one of the first portions 30A, and at least a part of each of the source regions 50S may be disposed in one of the second portions 30B. The drain region 30D and the source region 30S disposed in the same active region 30 are disposed at two opposite sides of the gate structure 40 in the first direction D1.

In some embodiments, a length of each of the first portions 30A in the first direction D1 (such as a first length L1 shown in FIG. 2) may be shorter than a length of each of the second portions 30B in the first direction D1 (such as a second length L2 shown in FIG. 2), and the second length L2 of each of the second portions 30B in the first direction D1 may be larger than a length of each of the third portions 30C in the first direction D1 (such as a third length L3 shown in FIG. 2), but not limited thereto. In some embodiments, the drain region 50D may be partly disposed in the first portion 30A and partly disposed in the third portion 30C. In some embodiments, a length of each of the drain regions 50D in the first direction D1 (such as a length L11 shown in FIG. 2) may be larger than a length of each of the source regions 50S in the first direction D1 (such as a length L21 shown in FIG. 2). In some embodiments, the length L21 of each of the source regions 50S in the first direction D1 may be substantially equal to the first length L1 of each of the first portions 30A in the first direction D1, and a length of each of the source regions 50S in the second direction D2 (such as a length L22 shown in FIG. 2) may be substantially equal to a length of each of the first portion 30A in the second direction D2 (such as the first width W1), but not limited thereto. The shaper and the area of each of the source region 50S may be the same as those of each of the first portions 30A in the third direction D3, and the length L11 of the drain region 50D may be relatively longer for high voltage operation concern.

As shown in FIG. 2 and FIG. 3, in some embodiments, the first width W1 of the first portion 30A may be regarded as the length of the first portion 30A in the second direction D2, the second width W2 of the second portion 30B may be regarded as the length of the second portion 30B in the second direction D2, and the third width W3 of the third portion 30C may be regarded as the length of the third portion 30C in the second direction D2. In some embodiments, a minimum length of each of the drain regions 50D in the second direction D2 (such as a length L13 shown in FIG. 2) may be substantially equal to the third width W3 of each of the third portions 30C, and a maximum length of each of the drain regions 50D in the second direction D2 (such as a length L12 shown in FIG. 2) may be substantially equal to the first width W1 of each of the first portions 30A, but not limited thereto.

Figure 4:
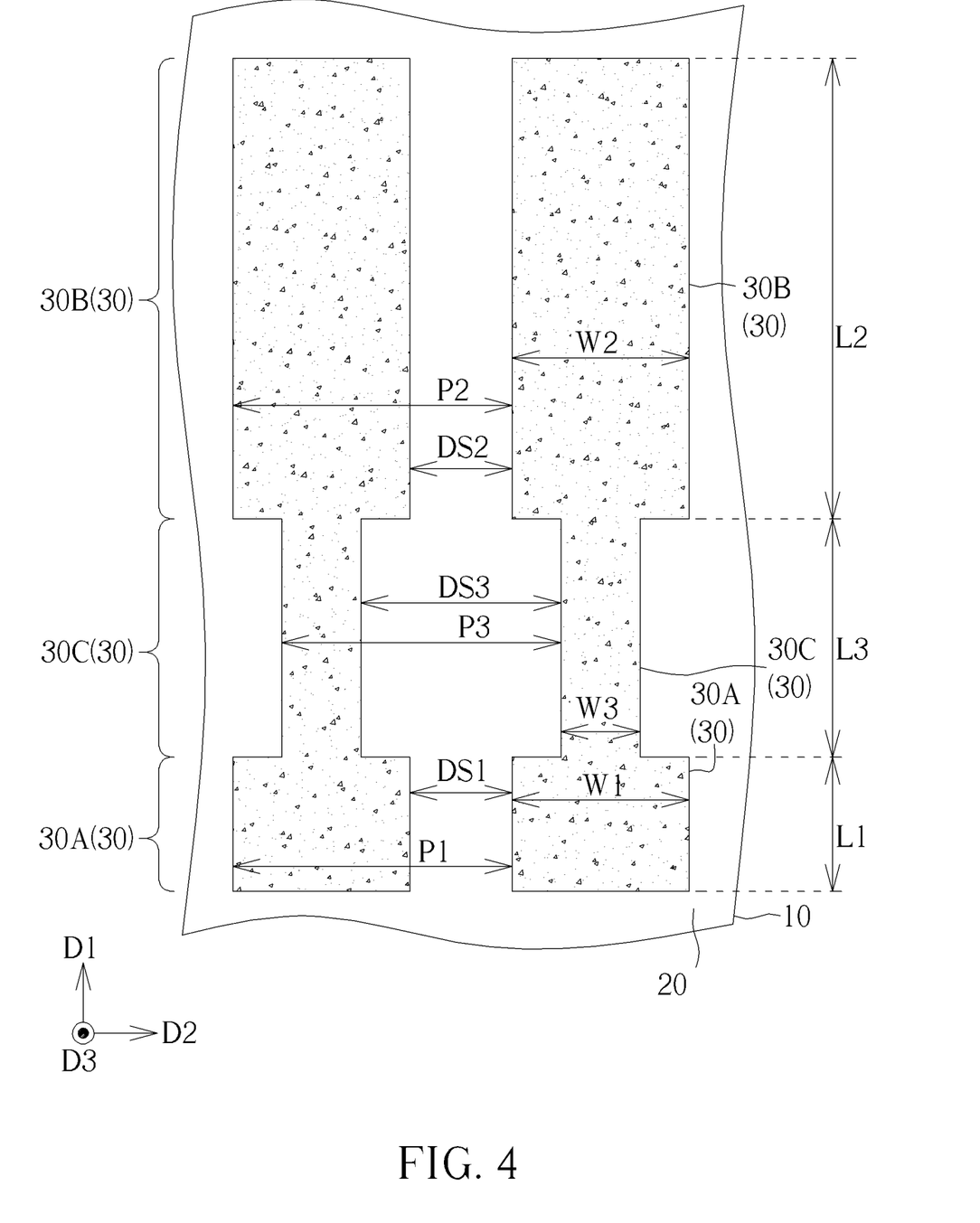
Figure 5:
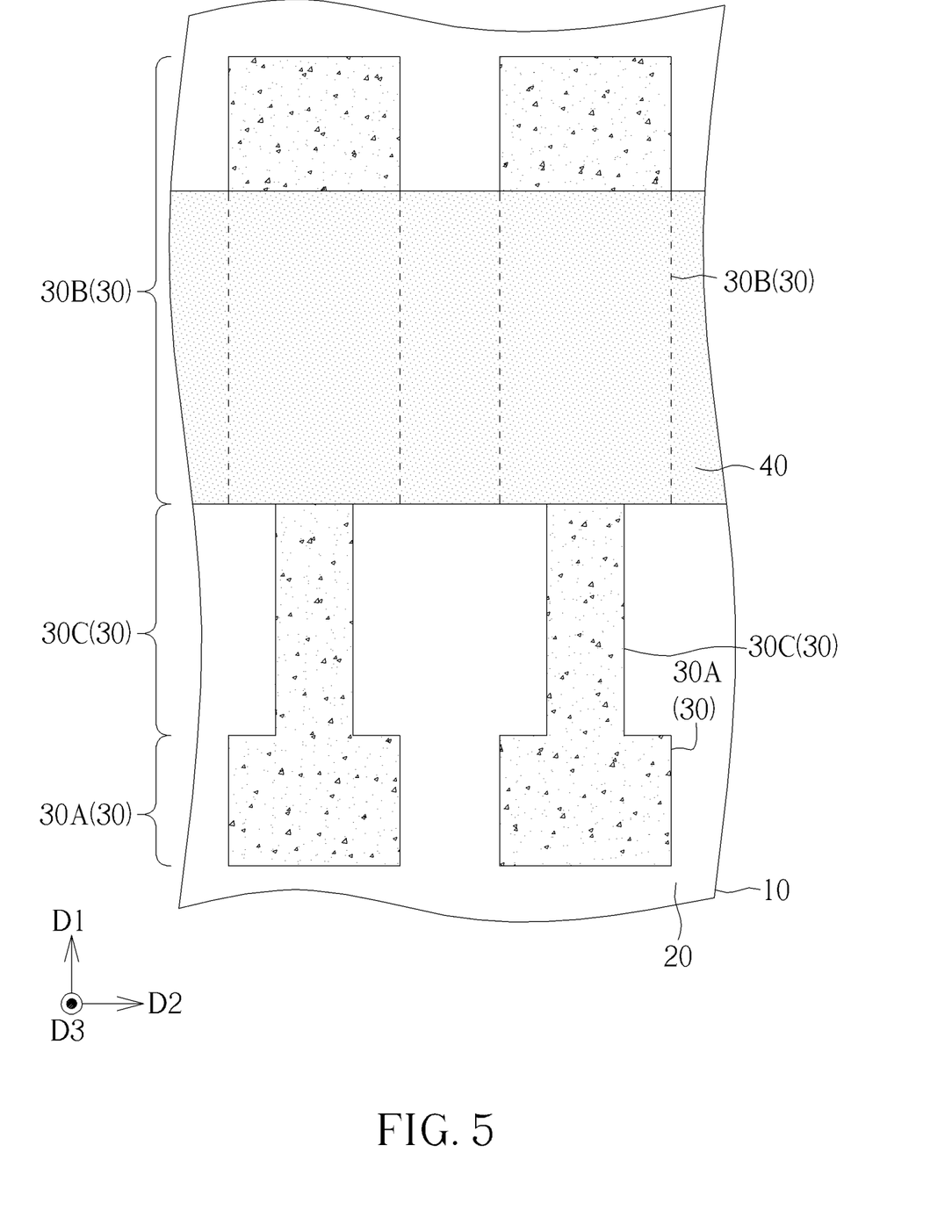
Figure 6:
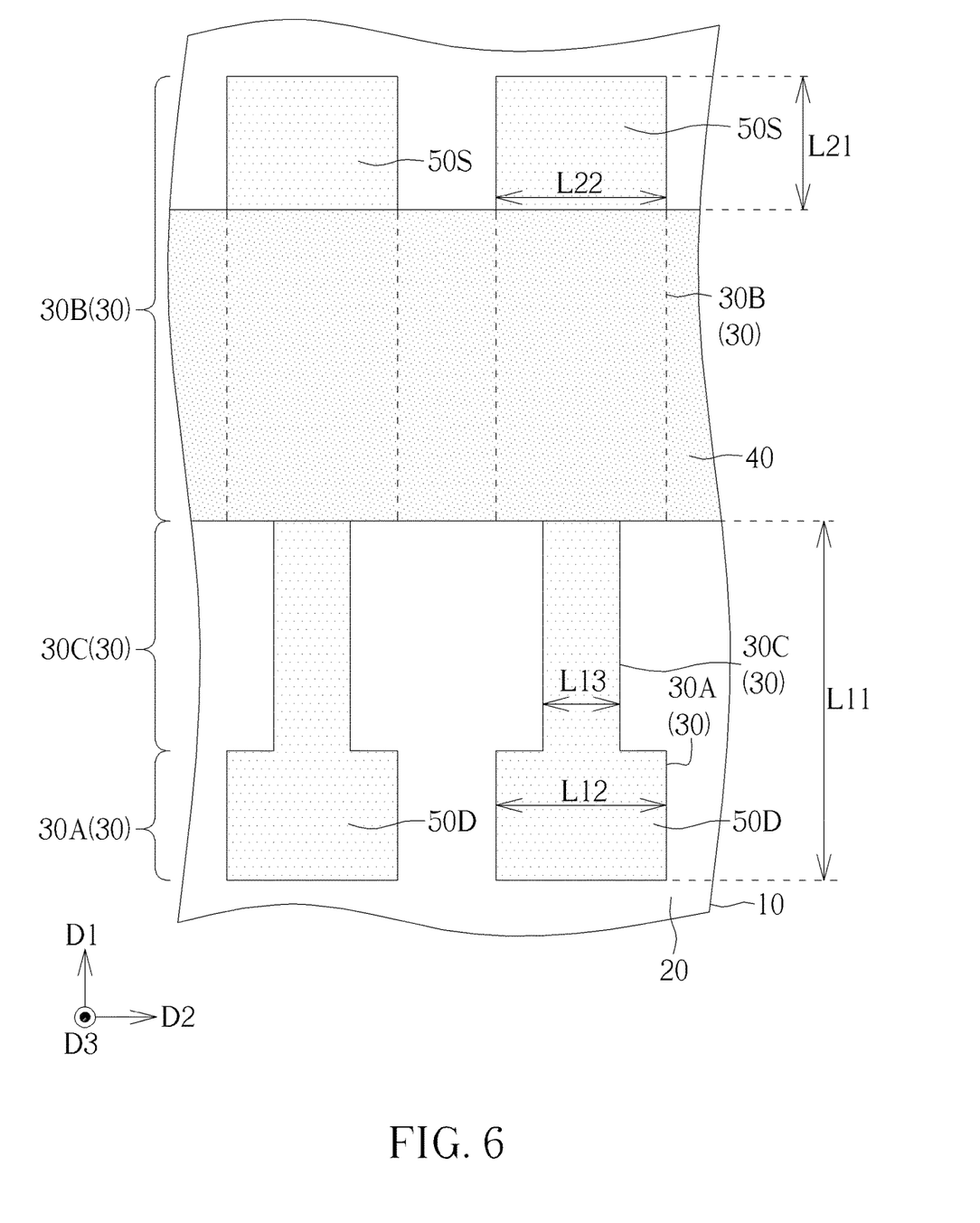

Please refer to FIG. 2 and FIGS. 4-6. FIGS. 4-6 are schematic drawings illustrating a manufacturing method of the bit line driver device in the first embodiment. FIG. 5 is a schematic drawing in a step subsequent to FIG. 4, FIG. 6 is a schematic drawing in a step subsequent to FIG. 5, and FIG. 2 may be regarded as a schematic drawing in a step subsequent to FIG. 6. The manufacturing method of the bit line driver device in this embodiment may include but is not limited to the following steps. As shown in FIG. 4, the isolation structure 20 is formed in the semiconductor substrate 10 for defining the active regions 30. The isolation structure 20 may be formed by forming a recess in the semiconductor substrate 10 and filling the recess with insulation material. Therefore, the active regions 30 may be a part of the semiconductor substrate 10 and are separated from one another by the isolation structure 20. In some embodiments, the isolation structure 20 may be regarded as a STI structure, and the shape of the active regions 30 (including the third portion 30C with a narrow width) may be controlled by the step of forming the isolation structure 20. As shown in FIG. 5, the gate structure 40 is formed to cover a part of each of the active regions 30. As shown in FIG. 6, the source regions 50S and the drain regions 50D are formed after the step of forming the gate structure 40. As shown in FIG. 2, the conductive structures 60 may be formed on the source regions 50S and the drain regions 50D for being electrically connected with the source regions 50S and the drain regions 50D respectively.

Figure 7:
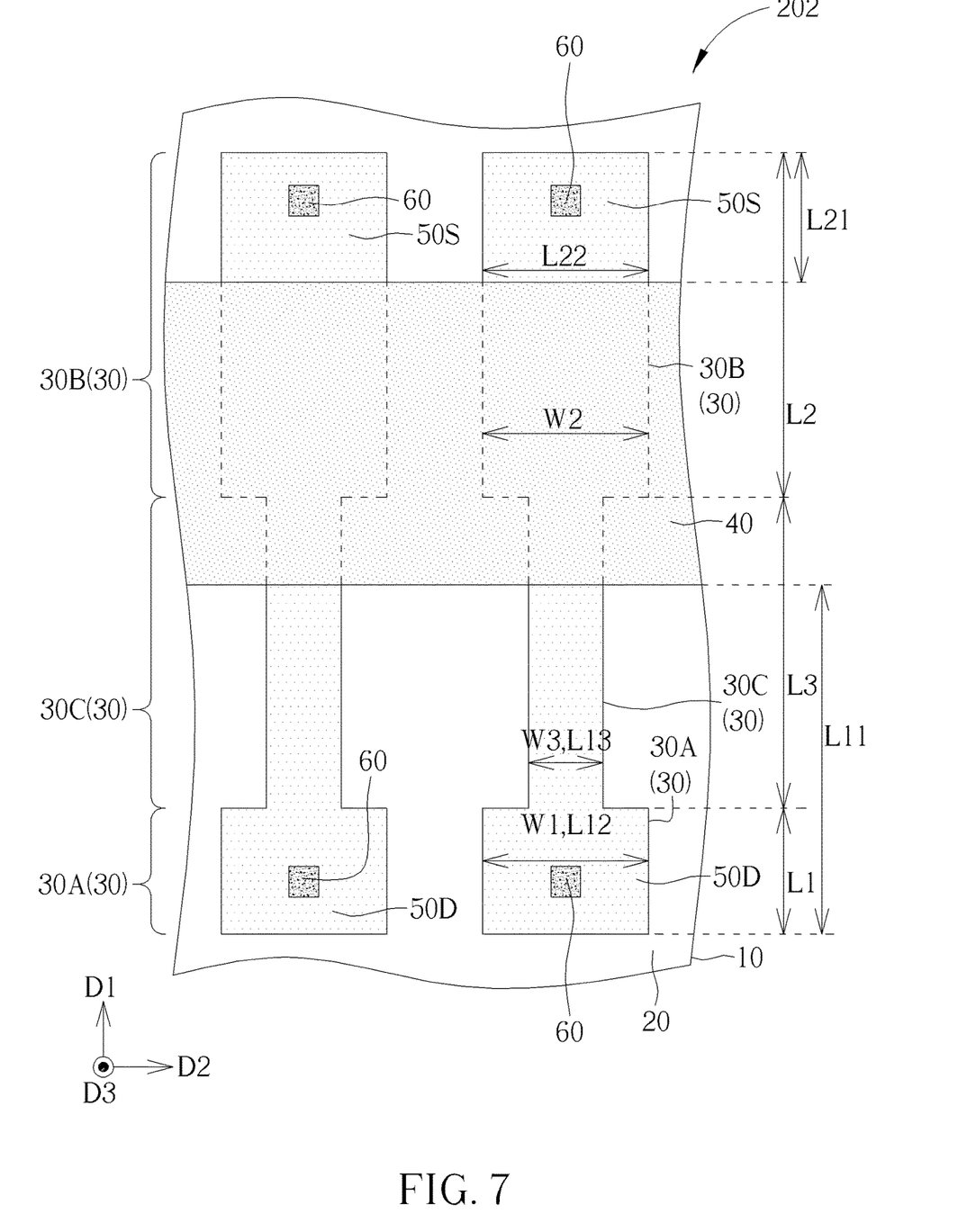
FIG. 7 is a schematic drawing illustrating a bit line driver device according to a second embodiment of the present disclosure.

Please refer to FIG. 7. FIG. 7 is a schematic drawing illustrating a bit line driver device 202 according to a second embodiment of the present disclosure. As shown in FIG. 7, the gate structure 40 may partly overlap the second portions 30B of the active areas 30 and partly overlap the third portions 30C of the active areas 30 in the thickness direction of the semiconductor substrate 10 (e.g. the third direction D3). Compared with the bit line driver device 201 shown in FIG. 2, the third length L3 of the third portion 30C in the bit line driver device 202 may be relatively longer, and the related electrical performance of the bit line driver device 202, such as drain-source breakdown voltage and/or punch-through voltage, may be further improved accordingly. However, the area of the active region 30 covered by the gate structure 40 may be relatively reduced in the bit line driver device 202, and some characteristics of the transistors in the bit line driver device 202 may be influenced. In other words, in the bit line driver device 201 shown in FIG. 2, the width of the active area 30 covered by the gate structure 40 is not reduced relatively, and the electrical performance between the transistors in the bit line driver device 201, such as drain-source breakdown voltage and/or punch-through voltage, may be improved without deteriorating some characteristics of each transistor in the bit line driver device 201.

Figure 8:
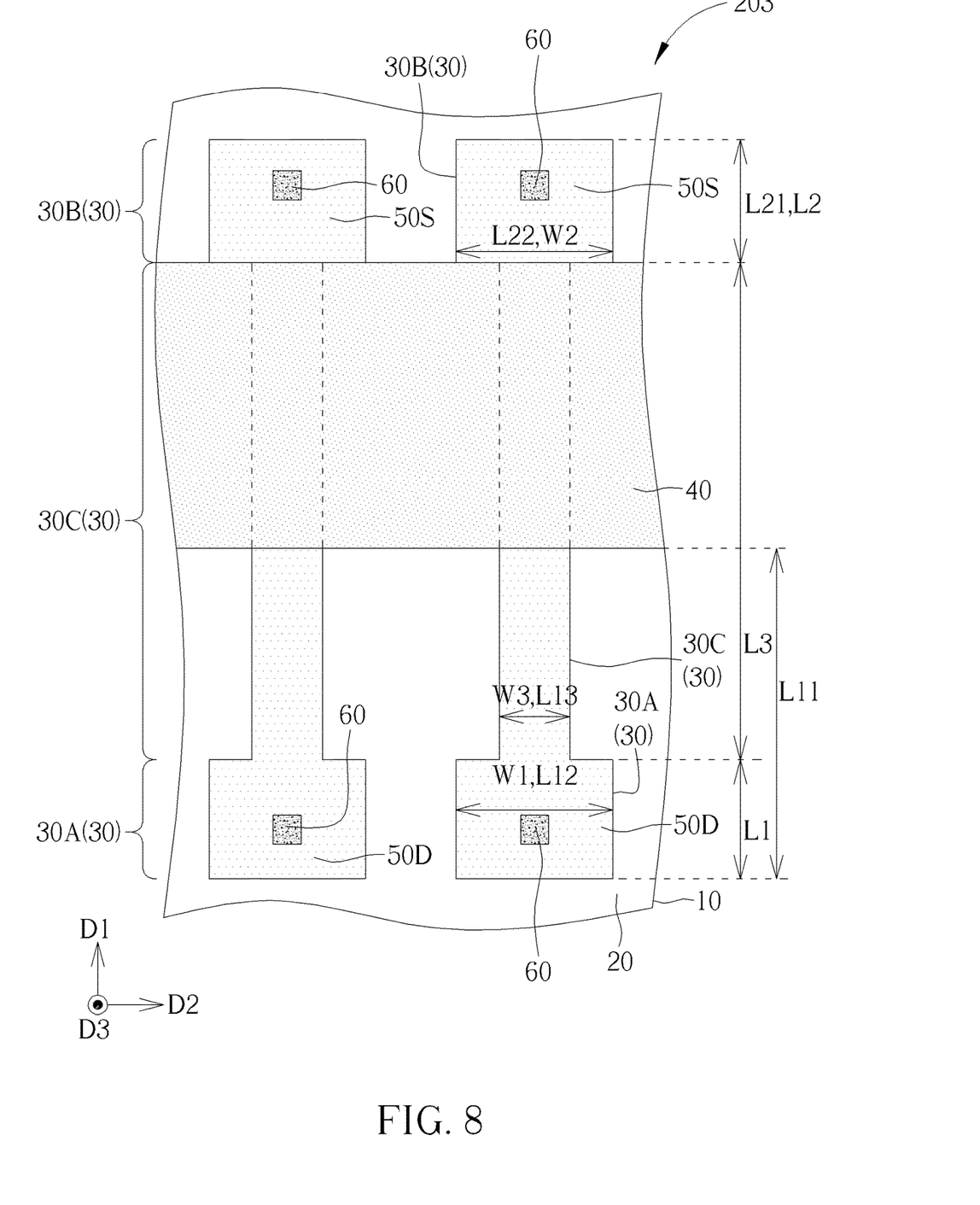
FIG. 8 is a schematic drawing illustrating a bit line driver device according to a third embodiment of the present disclosure.

Please refer to FIG. 8. FIG. 8 is a schematic drawing illustrating a bit line driver device 203 according to a third embodiment of the present disclosure. As shown in FIG. 8, the gate structure 40 may only overlap a part of each third portion 30C in the thickness direction of the semiconductor substrate 10 (e.g. the third direction D3). The third length L3 of each of the third portions 30C may be longer than the first length L1 of each of the first portions 30A and the second length L2 of each of the second portions 30B in this embodiment. In some embodiments, the first length L1 may be substantially equal to the second length L2, but not limited thereto.

Figure 9:
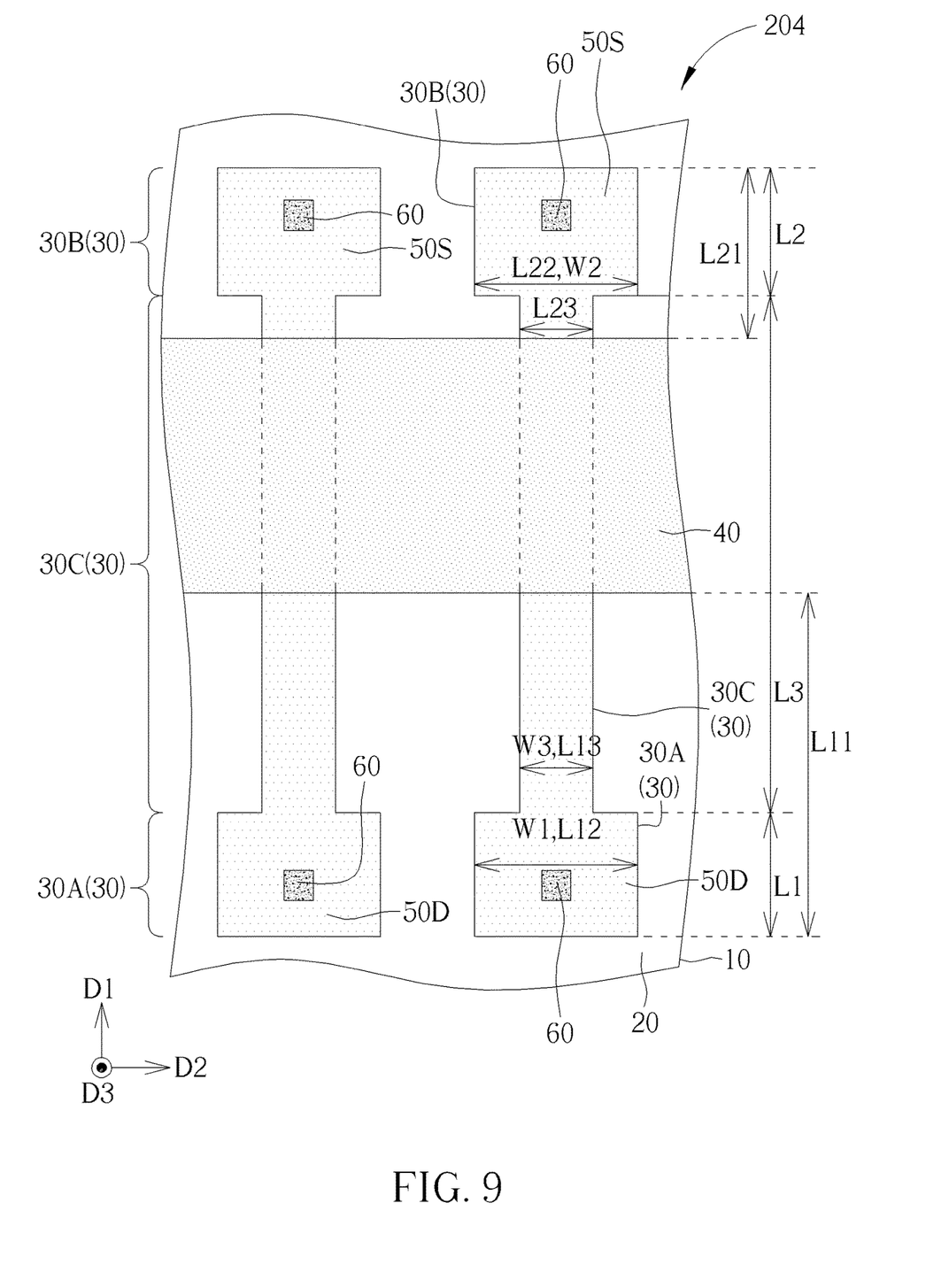
FIG. 9 is a schematic drawing illustrating a bit line driver device according to a fourth embodiment of the present disclosure.

Please refer to FIG. 9. FIG. 9 is a schematic drawing illustrating a bit line driver device 204 according to a fourth embodiment of the present disclosure. As shown in FIG. 9, each of the source regions 50S may be further disposed in the third portion 30C. In other words, each of the source regions 50S may be partly disposed in the second portion 30B and partly disposed in the third portion 30C, and each of the drain regions 50D may be partly disposed in the first portion 30A and partly disposed in the third portion 30C. In some embodiments, a minimum length of each of the source regions 50S in the second direction D2 (such as a length L23 shown in FIG. 9) may be substantially equal to the third width W3 of each of the third portions 30C, and a maximum length of each of the source regions 50S in the second direction D2 (e.g. the length L22 shown in FIG. 9) may be substantially equal to the second width W2 of each of the second portions 30B. In some embodiments, the second width of the second portion 30B may be substantially equal to the first width W1 of the first portion 30A, and the maximum length of each of the source regions 50S in the second direction D2 (e.g. the length L22) may be substantially equal to the maximum length of each of the drain regions 50D in the second direction D2 (e.g. the length L12).

To summarize the above descriptions, in the bit line driver device of the present disclosure, each active region may be modified to have a portion with smaller width for increasing the distance between two adjacent active areas, and the related electrical performance of the bit line driver device, such as drain-source breakdown voltage and/or punch-through voltage, may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bit line driver device, comprising:
   a semiconductor substrate;
   at least one isolation structure disposed in the semiconductor substrate for defining active regions in the semiconductor substrate, wherein each of the active regions is elongated in a first direction, two of the active regions are disposed adjacent to each other in a second direction, and each of the active regions comprises:
      a first portion and a second portion; and
      a third portion disposed between the first portion and the second portion in the first direction, wherein a width of the third portion is smaller than a width of the first portion and a width of the second portion;
   a gate structure disposed on the semiconductor substrate, wherein the gate structure is elongated in the second direction, and the gate structure partially overlaps each of the active regions, wherein the gate structure partially overlaps the second portions in a thickness direction of the semiconductor substrate, and the gate structure does not overlap the first portions in the thickness direction of the semiconductor substrate;
   drain regions disposed in the active regions, wherein at least a part of each of the drain regions is disposed in one of the first portions, and each of the drain regions is directly connected with the gate structure; and
   source regions disposed in the active regions, wherein at least a part of each of the source regions is disposed in one of the second portions, wherein the drain region and the source region disposed in the same active region are disposed at two opposite sides of the gate structure in the first direction.

2. The bit line driver device according to claim 1, wherein the width of the first portion is equal to the width of the second portion.

3. The bit line driver device according to claim 1, wherein a distance between the third portions in the second direction is larger than a distance between the first portions in the second direction and a distance between the second portions in the second direction.

4. The bit line driver device according to claim 3, wherein the distance between the first portions in the second direction is equal to the distance between the second portions in the second direction.

5. The bit line driver device according to claim 1, wherein a pitch between the third portions in the second direction is equal to a pitch between the first portions in the second direction and a pitch between the second portions in the second direction.

6. The bit line driver device according to claim 1, wherein the gate structure partially overlaps the third portions in the thickness direction of the semiconductor substrate.

7. The bit line driver device according to claim 1, wherein each of the drain regions is further disposed in the third portion.

8. The bit line driver device according to claim 7, wherein a minimum length of each of the drain regions in the second direction is equal to the width of each of the third portions.

9. The bit line driver device according to claim 7, wherein a maximum length of each of the drain regions in the second direction is equal to the width of each of the first portions.

10. The bit line driver device according to claim 7, wherein a length of each of the drain regions in the first direction is larger than a length of each of the source regions in the first direction.

11. The bit line driver device according to claim 1, wherein a length of each of the source regions in the second direction is equal to a length of each of the first portions in the second direction.

12. The bit line driver device according to claim 1, wherein a maximum length of each of the source regions in the second direction is equal to a maximum length of each of the drain regions in the second direction.

13. The bit line driver device according to claim 1, wherein the first direction and the second direction are orthogonal to the thickness direction of the semiconductor substrate.

* * * * *